United States Patent [19]

Burgess

[11] Patent Number: 5,012,184
[45] Date of Patent: Apr. 30, 1991

[54] ADJUSTMENT OF DISPOSITION OF ROTATION AXIS IN MOVING COIL MEASURING INSTRUMENTS TO CORRECT FOR THEIR NON-IDEAL OPERATION

[75] Inventor: Alan G. Burgess, Stafford, England
[73] Assignee: GEC Alsthom Limited, England
[21] Appl. No.: 482,524
[22] Filed: Feb. 21, 1990

[30] Foreign Application Priority Data

Mar. 3, 1989 [GB] United Kingdom ............... 8904886

[51] Int. Cl.⁵ ................... G01R 1/02; G01R 1/10
[52] U.S. Cl. ........................... 324/146; 324/150; 324/154 R; 324/154 PB
[58] Field of Search ........... 324/144, 146, 150, 151 R, 324/154 R, 154 PB, 155

[56] References Cited

U.S. PATENT DOCUMENTS

| | | | |
|---|---|---|---|
| 2,963,651 | 12/1960 | Richards et al. | 324/154 R |
| 3,624,505 | 11/1971 | Boreas | 324/154 R |
| 3,678,383 | 7/1972 | Boreas | 324/154 R |
| 4,039,944 | 8/1977 | Clift | 324/150 |
| 4,564,806 | 1/1986 | Kaise | 324/154 PB |

FOREIGN PATENT DOCUMENTS 2395511 6/1978 France .
2186982 8/1987 United Kingdom .

*Primary Examiner*—Kenneth Wieder
*Assistant Examiner*—Jack B. Harvey
*Attorney, Agent, or Firm*—Kirschstein, Ottinger, Israel & Schiffmiller

[57] ABSTRACT

A moving coil measuring instrument wherein at least one end of the axis (3) of rotation of the moving coil (1) is supported so as to permit adjustment of that end of the axis (3) in a direction substantially perpendicular to the axis (3), such adjustment correcting for non-ideal operation of the instrument. The adjustment is effected by rotation of a support member (5, 7), defining the one end, rotatably mounted in a frame member (9) of the instrument, the support member (5,7) defining the one end at a location displaced from the axis (31, 37) of rotation of the support member (5, 7).

5 Claims, 2 Drawing Sheets

ADJUSTMENT OF DISPOSITION OF ROTATION AXIS IN MOVING COIL MEASURING INSTRUMENTS TO CORRECT FOR THEIR NON-IDEAL OPERATION

BACKGROUND OF THE INVENTION

1. Field of the Invention

This invention relates to moving coil measuring instruments.

More particularly the invention relates to such instruments wherein the moving coil is supported for rotation about an axis defined by a pair of spaced support members mounted on a frame member of the instrument.

2. Description of Related Art

One known moving coil measuring instrument of this kind includes a magnetic circuit having two pole pieces which define an annular gap across which a magnetic field extends, the annular gap being substantially coaxial with the axis of rotation of the coil and a portion of the coil being disposed in the gap. In operation of this known instrument the interaction between an electrical current carried by the portion of the coil disposed in the gap and the magnetic field extending across the gap causes rotation of the coil, the angle through which the coil rotates indicating the value of the current carried by the coil.

The ideal linear operation of this known instrument, i.e. that equal increments in the current carried by the coil produce corresponding equal angular movements of the coil over the whole range of movement of the coil, can be adversely affected by the following: the tolerances of the various components of the instrument; the two pole pieces not being precisely concentric; foreign matter between mating surfaces of the instrument; the path taken by the portion of the coil disposed in the annular gap when the coil rotates not being precisely concentric with the annular gap; an unsymmetrical coil; and the support of the coil not being precise.

SUMMARY OF THE INVENTION

It is an object of the present invention to provide a moving coil measuring instrument wherein the adverse effect of the above factors on the operation of the instrument can be alleviated.

According to the present invention there is provided a moving coil measuring instrument including a moving coil supported for rotation about an axis defined by a pair of spaced support members mounted on a frame member of the instrument wherein at least one said support member is movable relative to said frame member whilst mounted thereon so as to permit adjustment of the position of an end of said axis defined by said one support member in a direction substantially perpendicular to said axis.

BRIEF DESCRIPTION OF THE DRAWINGS

Two moving coil measuring instruments in accordance with the present invention will now be described, by way of example, with reference to the accompanying drawings, in which.

DETAILED DESCRIPTION OF THE PREFERRED EMBODIMENTS

Figure 1:
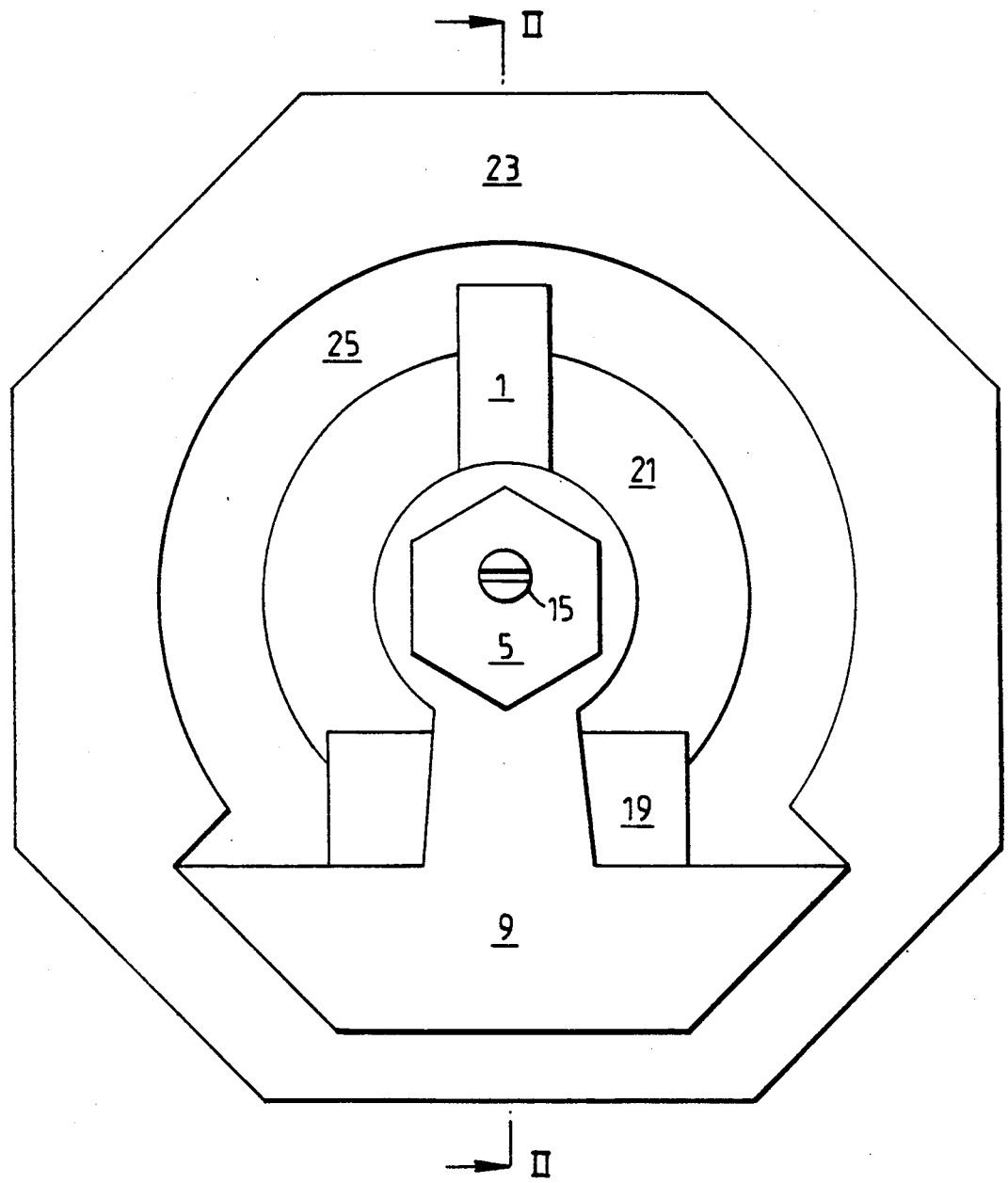
FIG. 1 is a schematic plan view of the first instrument.
Figure 2:
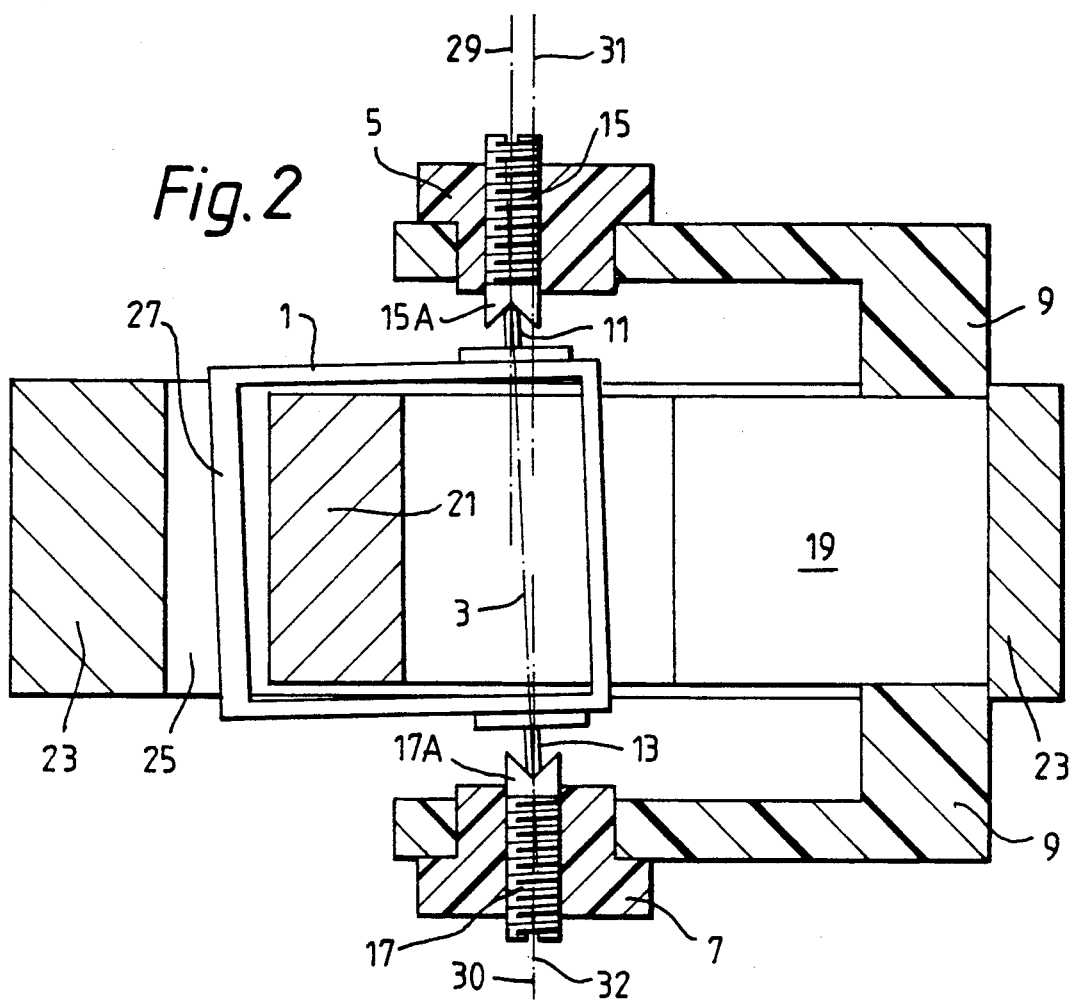
FIG. 2 is a cross-section along the line II—II in FIG. 1.

Referring to FIGS. 1 and 2, the first instrument comprises a rectangular moving coil 1 supported for rotation about an axis 3 defined by a pair of spaced support members in the form of bushes 5, 7 mounted on a frame member 9 of the instrument. The coil 1 is supported by means of pivots 11, 13 which locate in jewels 15A, 17A carried by jewel screws 15, 17 which screw into tapped holes in the bushes 5, 7 respectively. The instrument has a magnetic circuit comprising a rectangular permanent magnet 19 and a pair of concentric annular pole pieces 21, 23 which produces a magnetic field extending radially across an annular gap 25 defined between facing surfaces of the pole pieces 21, 23, the gap 25 being substantially coaxial with the axis 3 of rotation of the coil 1, and one side 27 of the coil 1 being disposed in the gap 25.

The bushes 5, 7 have hexagonal heads and are rotatably mounted in apertures extending through the frame member 9. The jewel screws 15, 17 are located in their respective bushes 5, 7 at positions such that their axes 29, 30 are parallel to but displaced from the axes 31, 32 of rotation of the bushes 5, 7.

It will be noted that the position of the bush 5 in the cross-sectional view of FIG. 2 is such as to clearly show the parallel spaced relation of the axes 29, 31, whereas the position of the bush 7 is such that both axes 30, 32 lie in a plane perpendicular to the plane of the paper and thus their parallel spaced relation is hidden. The different angular positions of the bushes 5, 7 account for the lop-sided disposition of the coil 1 in FIG. 2.

In operation of the instrument, the interaction between an electrical current carried by the side 27 of the coil 1 and the magnetic field extending across the gap 25 causes rotation of the coil 1 and hence movement of the side 27 of the coil 1 around the annular gap 25 against the return force provided by a return spring (not shown), the distance the side 27 moves around the annular gap 25 indicating the value of the current carried by the coil 1.

If during setting up of the instrument after assembly, the instrument is found not to operate ideally, i.e. such that equal increments in the current carried by the coil 1 fail to produce corresponding equal angular movements of the coil 1 over the whole range of movement of the coil 1, correction can be effected by rotation either of one or both of the bushes 5, 7 within the frame member 9 so as to adjust the position of the one or both ends of the axis of rotation 3 of the coil 1 defined by the bushes 5, 7 in a direction substantially perpendicular to the axis of rotation 3, such adjustment altering the disposition of the side 27 of the coil 1 in the gap 25.

Figure 3:
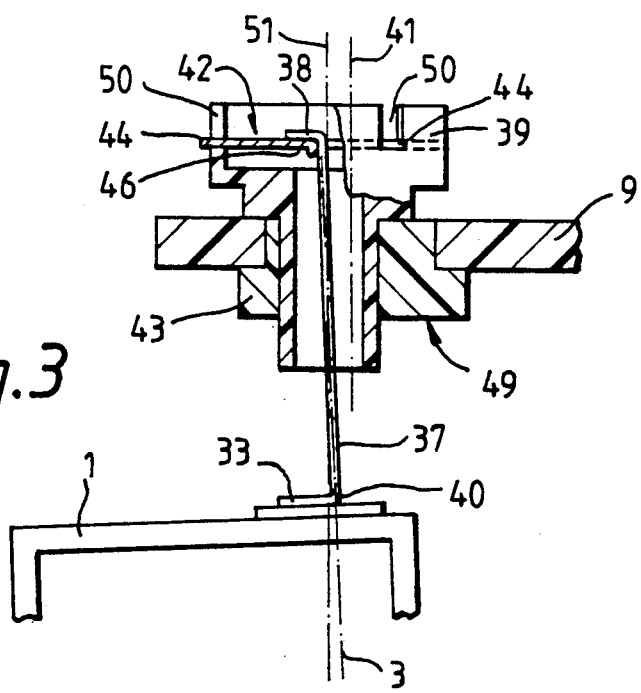
FIG. 3 is a schematic cross-section of a part of the second moving coil measuring instrument.

Referring to FIG. 3, the second instrument is substantially the same as the first except that the moving coil 1 is supported for rotation by means of a taut band suspension instead of a jewel and pivot suspension. The taut band suspension is substantially the same on each side of the coil 1, and the suspension above the coil 1 only is therefore shown in FIG. 3 and will be described.

The suspension above the coil 1 comprises a taut band 37 supported at one end 38 by an inner bush 39, rotatably mounted in an outer bush 43 rotatably mounted on a frame member 9 of the instrument, and secured at the other end 40 to the top side of the coil by a clip 33. The end 38 is supported by the inner bush 39 by way of a spring 42 formed from thin sheet metal and of basically annular shape with outwardly extending rectangular lugs 44 and an inwardly extending arm 46 terminating with a smooth edge just before the center of the spring 42. To the arm 46 is attached the end 38 of the band 37 so as to pass over the smooth edge. The spring 42 is held in position by abutment with the inner bush 39. The bush 39 is castellated at the end remote from the coil 1 so as to provide parallel sided axially extending slots 50 corresponding in number and position to the lugs 44. The spring 42 is positioned in the bush 39 with its lugs 44 abutting the bases of respective slots 50 of the bush 39.

The outer bush 43 has a hexagonal head 49. The inner bush 39 is mounted in the outer bush 43 such that its axis 51 is parallel to but displaced from the axis of rotation 41 of the outer bush 43.

In operation of the second instrument rotation of the coil 1 is against the return force provided by the taut band suspension. Hence a spring corresponding to the return spring of a pivot and jewel suspension is not required.

Adjustment of the position of the axis of rotation 3 of the coil 1, and hence the position of the coil 1 in the gap 25 is effected, as in the FIG. 1 instrument, by rotation of one or both of the outer bushes 43 in the frame 9. The inner bushes 39 are made rotatable in the outer bushes 43 so that changes in the zero position of the coil 1 produced by rotation of the outer bushes 43 can be cancelled by contra-rotation of the inner bushes 39.

I claim:

1. A moving coil measuring instrument comprising: a moving coil supported for rotation about an axis defined by a pair of spaced support members mounted on a frame member of the instrument, at least one of said support members being controllably movable relative to said frame member while mounted thereon so as to reposition said one support member relative to said frame member and thereby permit adjustment of the position of one end of said axis defined by said one support member in a direction substantially perpendicular to said axis.

2. An instrument according to claim 1 wherein said instrument includes a magnetic circuit which provides a magnetic field extending radially across an annular air gap in the magnetic circuit which is substantially coaxial with the axis of rotation of the coil, a portion of the coil being disposed in said gap.

3. An instrument according to claim 1 wherein said one support member is mounted on said frame member for rotation about an axis fixed with respect to said frame member and said one end is defined by said one support member at a location displaced from the axis of rotation of said one support member.

4. An instrument according to claim 3 wherein said coil is supported by means of a pivot and jewel suspension, the jewels of which are carried by said support members.

5. An instrument according to claim 3 wherein said coil is supported for rotation by means of a taut band suspension each end of the taut band of which is supported by a member mounted rotatably on a respective one of said support members.

* * * * *